US010405453B1

(12) United States Patent
Cunningham

(10) Patent No.: US 10,405,453 B1
(45) Date of Patent: Sep. 3, 2019

(54) SYSTEMS AND METHODS FOR CARRIER-LESS STORAGE DEVICE EXTRACTION IN AN INFORMATION HANDLING SYSTEM

(71) Applicant: Dell Products L.P., Round Rock, TX (US)

(72) Inventor: William Brian Cunningham, Westborough, MA (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/002,979

(22) Filed: Jun. 7, 2018

(51) Int. Cl.
| H05K 7/20 | (2006.01) |
| H05K 7/18 | (2006.01) |
| H01R 25/00 | (2006.01) |
| G06F 1/18 | (2006.01) |
| H01R 13/631 | (2006.01) |
| H05K 7/14 | (2006.01) |

(52) U.S. Cl.
CPC ............. H05K 7/183 (2013.01); G06F 1/183 (2013.01); H01R 13/631 (2013.01); H01R 25/006 (2013.01); H05K 7/1489 (2013.01)

(58) Field of Classification Search
CPC .. H05K 7/1487; H05K 7/1488; H05K 7/1489; H05K 7/186
USPC ......... 361/679.37, 679.38, 679.39, 724, 727, 361/728
See application file for complete search history.

(56) References Cited

U.S. PATENT DOCUMENTS

| 7,167,371 | B2 * | 1/2007 | Coles ................... H05K 7/1409 312/223.1 |
| 8,376,296 | B2 * | 2/2013 | Yu .......................... G06F 1/187 248/205.1 |
| 9,389,652 | B2 * | 7/2016 | Liu .......................... G06F 1/187 |
| 9,629,275 | B1 * | 4/2017 | Beall ...................... G11B 33/128 |
| 9,763,353 | B1 * | 9/2017 | Beall .................... H05K 7/1488 |
| 2009/0016009 | A1 * | 1/2009 | Barrall ..................... G06F 1/187 361/679.31 |
| 2009/0097196 | A1 * | 4/2009 | Peng ....................... G06F 1/187 361/679.34 |
| 2014/0345105 | A1 * | 11/2014 | Brockett ................. G06F 1/187 29/428 |
| 2015/0015131 | A1 * | 1/2015 | Privitera ................. G06F 1/183 312/309 |
| 2015/0092341 | A1 * | 4/2015 | Liu .......................... G06F 1/187 361/679.39 |
| 2019/0075668 | A1 * | 3/2019 | Adrian ................. G11B 5/4806 |

* cited by examiner

Primary Examiner — Anthony Q Edwards
(74) Attorney, Agent, or Firm — Baker Botts L.L.P.

(57) ABSTRACT

Systems and methods are disclosed for carrier-less storage device extraction in an information handling system. A carrier-less storage shuttle includes two sides rigidly affixed to an enclosure assembly and a latch assembly configured to affix a storage device at an engaged position within the enclosure assembly. The carrier-less storage shuttle further includes a strap movably coupled to the two sides, a first end of the strap coupled to the latch assembly, and a second end of the strap coupled to a second side of the two sides. When the storage device is in the engaged position, a bottom surface of the storage device is in contact with the strap, and the latch assembly is moved in a generally outward direction from the enclosure assembly, the strap moves in response such that the storage device moves from the engaged position to a disengaged position.

20 Claims, 10 Drawing Sheets

SYSTEMS AND METHODS FOR CARRIER-LESS STORAGE DEVICE EXTRACTION IN AN INFORMATION HANDLING SYSTEM

BACKGROUND

Field of the Disclosure

This disclosure relates generally to information handling systems and, more particularly, to systems and methods for carrier-less storage device extraction in an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In today's information technology (IT) infrastructure, high availability of information handling systems is of paramount importance. Specifically, critical (and sometimes non-critical) components within an IT infrastructure are often layered in redundancy. For example, primary servers may be supported by backup servers, primary switches may be supported by backup switches, primary power supplies may be supported by backup power supplies, and primary storage systems may be supported by backup storage systems.

Oftentimes, various IT components are mounted within IT racks and need to be serviced in the field. Naturally, the quicker these IT components can be serviced, the less downtime for the IT component.

SUMMARY

In one embodiment, a disclosed carrier-less storage shuttle may include a first side having a first guide channel and a second side. The first side and the second side may be rigidly affixed to an enclosure assembly. The carrier-less storage shuttle may also include a latch assembly that may releasably affix a storage device at an engaged position within the enclosure assembly and a strap including a first end coupled to the latch assembly, a second end coupled to the second side. The strap may be movably coupled within the first guide channel. The strap may, when the storage device is in the engaged position, a bottom surface of the storage device is in contact with the strap, and the latch assembly is unlatched and moved in a generally outward direction from the enclosure assembly, move in the generally outward direction within the first guide channel such that the storage device moves from the engaged position to a disengaged position.

In a number of the disclosed embodiments of the carrier-less storage shuttle, the strap may also, when the strap is contacted by the bottom surface of the storage device and the storage device is moved into the engaged position, move within the first guide channel from an extracted position to a ready to extract position.

In a number of the disclosed embodiments of the carrier-less storage shuttle, the carrier-less storage shuttle may also include a stop assembly coupled to the second side in a fixed position. The stop assembly may limit an amount of travel of the strap when the storage device is moved by the strap from the engaged position to the disengaged position such that the storage device may remain in the carrier-less storage shuttle.

In a number of the disclosed embodiments of the carrier-less storage shuttle, the second side may also include a second guide channel. The strap may also be movably coupled within the second guide channel.

In a number of the disclosed embodiments of the carrier-less storage shuttle, the carrier-less storage device may also include a bottom side having a third guide channel rigidly affixed to the enclosure assembly. The strap may also be movably coupled within the third guide channel.

In a number of the disclosed embodiments of the carrier-less storage shuttle, the carrier-less storage device may also electrically couple the storage device to an enclosure electrical connector within the enclosure assembly when the storage device is moved into the engaged position.

In a number of the disclosed embodiments of the carrier-less storage shuttle, the carrier-less storage device may also electrically uncouple the storage device from an enclosure electrical connector within the enclosure assembly when the storage device is moved into the disengaged position.

In a number of the disclosed embodiments of the carrier-less storage shuttle, the latch assembly may also include a bias device that may bias the storage device toward an enclosure electrical connector within the enclosure assembly when the storage device is moved into the engaged position.

In a number of the disclosed embodiments of the carrier-less storage shuttle, the latch assembly may also include a first lock portion. The first lock portion may include a tab coupled to a first end of the first lock portion and a first handle portion coupled to a second end of the first lock portion. The latch assembly may further include a second lock portion. The second lock portion may include a first handle portion coupled to a first end of the first lock portion. The latch assembly may also include a spring disposed within the first lock portion between the first end and the second end. The spring may exert a first force on the tab in a direction towards the first end of the first lock portion. The latch assembly may also, when the first handle portion and the second handle portion are squeezed together, the tab may disengage from a first mating slot of the first side and the second end of the second lock portion may disengage from a second mating slot of the second side that may allow the latch assembly to be moved in the outward direction away from the carrier-less storage shuttle. The latch assembly may further, when the latch assembly is moved to a latched position, the tab may engage with the first mating slot and the second end of the second lock portion may engage with the second mating slot to cause the latch assembly to lock.

In a number of the disclosed embodiments of the carrier-less storage shuttle, each of the first side and the second side may also include a respective alignment channel for aligning the storage device within the carrier-less storage shuttle.

In a number of the disclosed embodiments of the carrier-less storage shuttle, when the storage device is in the engaged position, a first portion of the strap may be within the first guide channel, a second portion of the strap may be within the second guide channel, and a third portion of the strap between the first side and the second side may be within a third guide channel of a bottom side of the carrier-less storage shuttle and generally parallel to the bottom surface of the storage device.

In a number of the disclosed embodiments of the carrier-less storage shuttle, when the storage device is in the disengaged position, a first portion of the strap may be within the first guide channel, a second portion of the strap may be within the second guide channel, a third portion of the strap between the first side and the second side may be above a third guide channel of a bottom side of the carrier-less storage shuttle and generally parallel to the bottom surface of the storage device, and a fourth portion of the strap proximate the latch assembly may be outside a top portion of the first side.

In a second embodiment, a disclosed carrier-less storage shuttle may include a first side having a first guide channel and a second side having a second guide channel. The first side and the second side may be rigidly affixed to an enclosure assembly. The carrier-less storage shuttle may also include a latch assembly that may releasably affix a storage device at an engaged position within the enclosure assembly. The carrier-less storage shuttle may also include a strap including a first end coupled to the latch assembly and a second end coupled to the second side. The strap may be movably coupled within the first guide channel and the second guide channel. The strap may, when the storage device is in the engaged position, a bottom surface of the storage device is in contact with the strap, and the latch assembly is unlocked and moved in a generally outward direction from the enclosure assembly, move in the generally outward direction within the first guide channel and the second guide channel such that the storage device may electrically uncoupled from an enclosure electrical connector within the enclosure assembly and may move from the engaged position to a disengaged position.

In a number of the disclosed embodiments of the carrier-less storage shuttle, the strap may also, when the strap is contacted by the bottom surface of the storage device and the storage device is moved into the engaged position, the strap may be moved within the first guide channel and the second guide channel from an extracted position to a ready to extract position.

In a number of the disclosed embodiments of the carrier-less storage shuttle, the carrier-less storage shuttle may also include a stop assembly coupled to the second side in a fixed position. The stop assembly may limit an amount of travel of the strap when the storage device is moved by the strap from the engaged position to the disengaged position such that the storage device may remain in the carrier-less storage shuttle.

In a number of the disclosed embodiments of the carrier-less storage shuttle, when the storage device is in the disengaged position, a first portion of the strap may be within the first guide channel, a second portion of the strap may be within the second guide channel, a third portion of the strap between the first side and the second side may be above a third guide channel of a bottom side of the carrier-less storage shuttle and generally parallel to the bottom surface of the storage device, and a fourth portion of the strap proximate the latch assembly may be outside a top portion of the first side.

In a third embodiment, a disclosed carrier-less storage shuttle may include a first side having a first guide channel and a second side having a second guide channel. The first side and the second side may be rigidly affixed to an enclosure assembly. The carrier-less storage shuttle may also include a handle assembly and a strap including a first end coupled to the handle assembly, a second end coupled to the second side, and the strap movably coupled within the first guide channel and the second guide channel. The strap may, when the storage device is in an engaged position within the enclosure assembly, a bottom surface of the storage device is in contact with the strap, and the handle assembly is moved in a generally outward direction from the enclosure assembly, move in the generally outward direction within the first guide channel and the second guide channel such that the storage device may move from the engaged position to a disengaged position.

In a number of the disclosed embodiments of the carrier-less storage shuttle, the strap may, when the strap is contacted by the bottom surface of the storage device and the storage device is moved into the engaged position, the strap may be moved within the first guide channel and the second guide channel from an extracted position to a ready to extract position.

In a number of the disclosed embodiments of the carrier-less storage shuttle, the carrier-less storage shuttle may also include a stop assembly coupled to the second side in a fixed position. The strap may limit an amount of travel of the strap when the storage device is moved by the strap from the engaged position to the disengaged position such that the storage device remains in the carrier-less storage shuttle.

In a number of the disclosed embodiments of the carrier-less storage shuttle, when the storage device is in the disengaged position, a first portion of the strap may be within the first guide channel, a second portion of the strap may be within the second guide channel, a third portion of the strap between the first side and the second side may be above a third guide channel of a bottom side of the carrier-less storage shuttle and generally parallel to the bottom surface of the storage device, and a fourth portion of the strap proximate the handle assembly may be outside a top portion of the first side.

BRIEF DESCRIPTION OF THE DRAWINGS

For a more complete understanding of the present invention and its features and advantages, reference is now made to the following description, taken in conjunction with the accompanying drawings, in which.

DESCRIPTION OF PARTICULAR EMBODIMENT(S)

Figure 1:
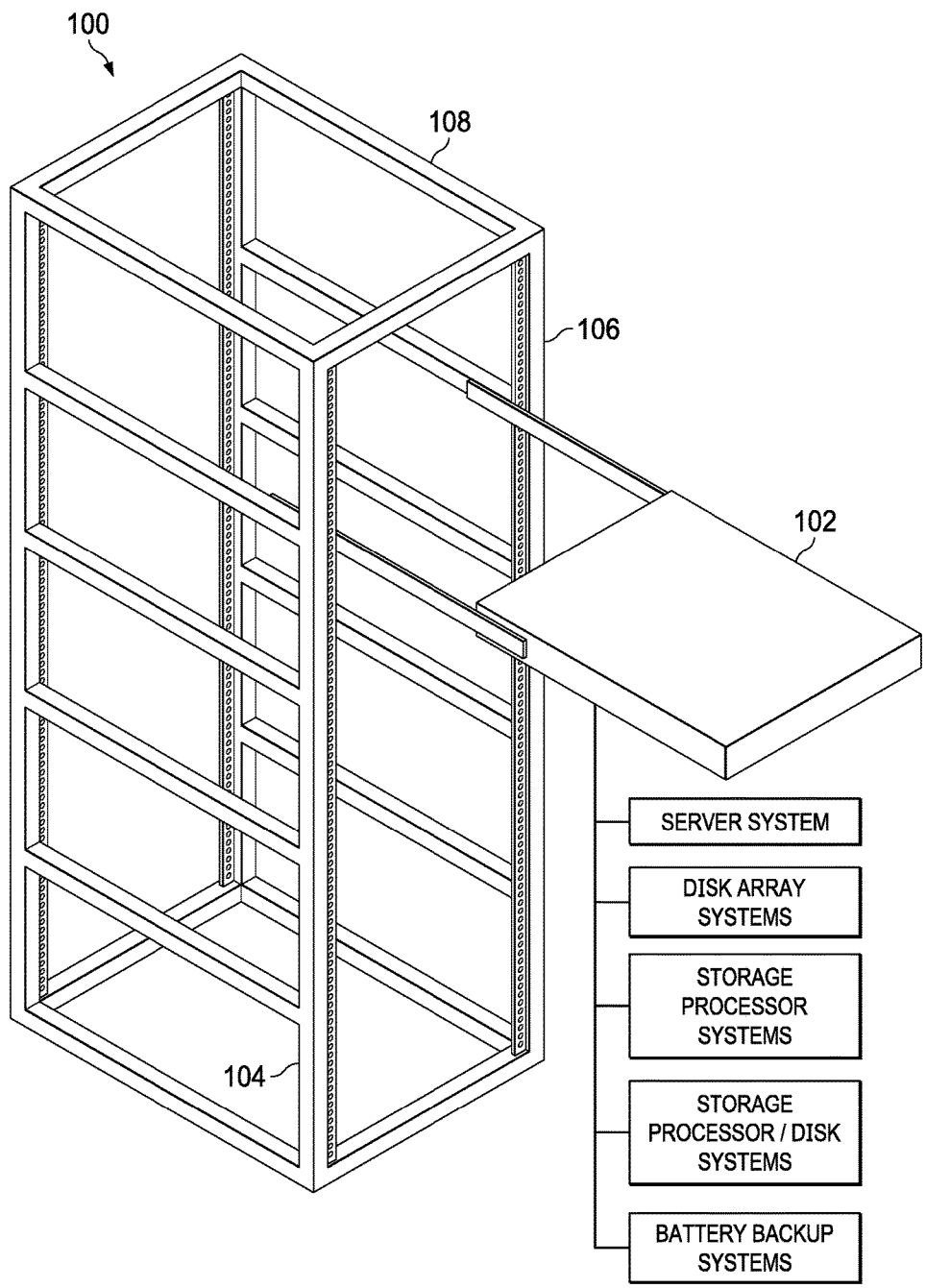
FIG. 1 is a perspective view of selected elements of an embodiment of an IT rack and an IT component.

In the following description, details are set forth by way of example to facilitate discussion of the disclosed subject matter. It should be apparent to a person of ordinary skill in the field, however, that the disclosed embodiments are exemplary and not exhaustive of all possible embodiments.

As used herein, a hyphenated form of a reference numeral refers to a specific instance of an element and the un-hyphenated form of the reference numeral refers to the collective or generic element. Thus, for example, widget "72-1" refers to an instance of a widget class, which may be referred to collectively as widgets "72" and any one of which may be referred to generically as a widget "72."

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-10 wherein like numbers are used to indicate like and corresponding parts.

Turning now to the drawings, FIG. 1 illustrates a block diagram depicting selected elements of an Referring to FIG. 1, IT racks (e.g., IT rack 100) may be utilized to store and organize IT components. For example, IT rack 100 may be placed within a computer room and various IT components (e.g., IT component 102) may be attached to rails (e.g., national electrical manufacturer association (NEMA) rails 104, 106) included within IT rack 100, wherein these rails (e.g., NEMA rails 104, 106) may have a standard and defined spacing between them (e.g., 19"). Typically, IT components that are configured to fit within IT rack 100 may be described as rack-mountable IT components.

Examples of the various IT components (e.g., IT component 102) mountable within IT rack 100 may include but are not limited to: server systems, disk array systems, storage processor systems, storage processor/disk systems, and battery backup systems.

IT rack 100 may include frame 108 (which may include one or more vertical supports, horizontal supports, and cross braces) to which NEMA rails 104, 106 may be attached. NEMA rails 104, 106 may include a plurality of evenly spaced holes that may be configured for mounting the various IT components within IT rack 100. By standardizing the spacing between NEMA rails 104, 106, the various IT components that fit within a first IT rack may also fit within a second IT rack.

Typically, IT racks are defined in accordance with the number of rack units (U's) included within the rack. For example, a 1U IT component is half as high as a 2U IT component, which is half as high as a 4U IT component. Accordingly, while the number of rack units available within a particular IT rack may be rigidly defined by the size of the IT rack, the number of IT components mountable within that IT rack may vary depending upon the size (in rack units) of the particular IT components being mounted within that IT rack. Therefore, by reducing the number of rack units that a particular IT component uses within an IT rack, additional IT computing devices may be mounted within the IT rack.

Figure 2A:
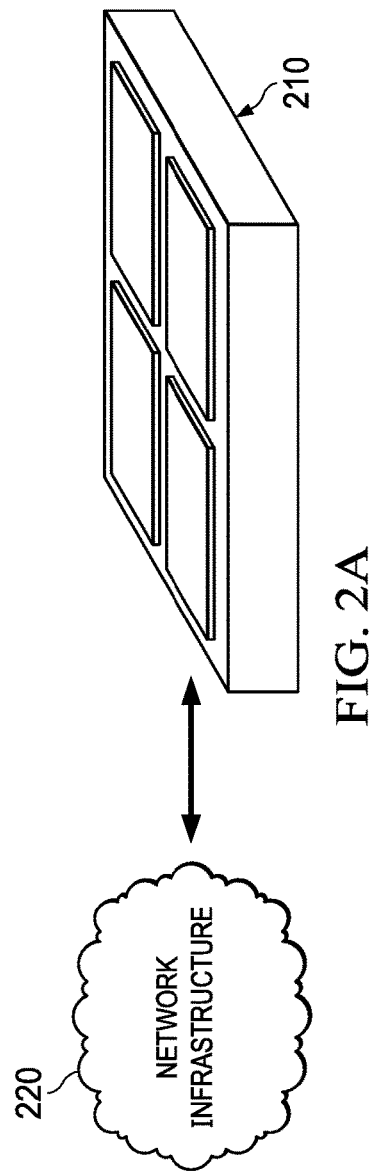
FIG. 2A is a diagrammatic view of selected elements of an embodiment of a rack-mountable computing device for use within the IT rack of FIG. 1.
Figure 2B:
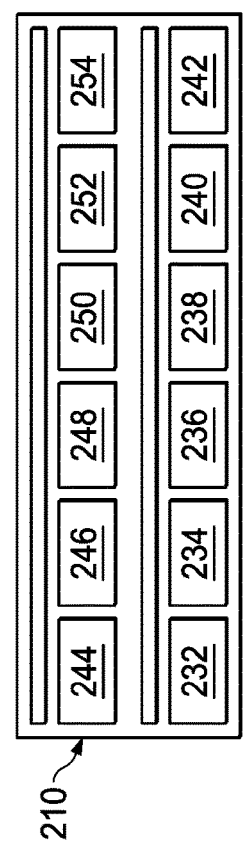
FIG. 2B is a front view of selected elements of an embodiment of a rack-mountable computing device of FIG. 2A.

Referring to FIG. 2A, there is shown one example of IT component 102, namely rack-mountable computing device 210. In this particular embodiment, rack-mountable computing device 210 may include a plurality of individual components, examples of which may include but are not limited to storage components, input/output components, and processing components, any of which may be a field replaceable unit (FRU) that is serviceable in the field.

Storage components may be the portion of rack-mountable computing device 210 that is configured to store data. Examples of such data may include but are not limited to data that is generated remotely (e.g., by applications that are executed on remote devices) or data that is generated locally (e.g., by applications that are executed on rack-mountable computing device 210). Accordingly, the storage component may be configured to include one or more storage devices, examples of which may include but are not limited to one or more rotating-media disk drives (e.g., SATA drives or SCSI drives) and/or one or more solid state storage devices (e.g., flash drives). For example and as shown in FIG. 2A, the storage component of rack-mountable computing device 210 may be configured to include (in this example) twelve 2.5 inch form factor storage devices (e.g., storage devices 232, 234, 236, 238, 240, 242, 244, 246, 248, 250, 252, 254).

The input/output components of rack-mountable computing device 210 may be the portion of rack-mountable computing device 210 that is configured to couple rack-mountable computing device 210 to a network infrastructure (e.g., network infrastructure 220), wherein network infrastructure 220 may be configured to couple rack-mountable computing device 210 to other rack-mountable computing devices, other IT components (e.g., server systems, disk array systems, storage processor systems, storage processor/disk systems, and battery backup systems), other networking devices (e.g., switches, routers, bridges, wireless access points), and/or end user computing devices (e.g., desktop computers, laptop computers, notebook computers, smartphones, tablet computers, etc.). Examples of network infrastructure 220 may include but are not limited to an Ethernet infrastructure; a fiber channel infrastructure; and an Infini-Band infrastructure.

The processing components of rack-mountable computing device 210 may be the portion of rack-mountable computing device 210 that is configured to process data, such as data that is generated remotely (e.g., by applications that are executed on remote devices) or data that is generated locally (e.g., by applications that are executed on rack-mountable computing device 210). Accordingly, the processing components of rack-mountable computing device 210 may be configured to include one or more microprocessors.

Through the use of rack-mountable computing device 210, rack-mountable computing device 210 may be configured to be easily serviceable in the field by service technicians. Specifically, the storage devices (e.g., storage devices 232, 234, 236, 238, 240, 242, 244, 246, 248, 250, 252, 254) may be configured to be removed and/or installed from rack-mountable computing device 210 without requiring the use of tools.

As noted previously, a storage device such as storage devices 232 may be installed and/or removed from rack-mountable computing device 210. Typically, a storage device carrier is a frame that is assembled to a storage device to provide insertion and extraction points usually consisting of a cam and a latch, which allows the storage device to be installed and/or removed from rack-mountable computing device 210. These storage device carriers may be custom to the chassis that receives them and may not be universal for all chassis. If the same storage device is used in several chassis it is possible to require several different storage device carriers to match those chassis. For providing storage device spares one would have to stock the storage device plus the storage device carrier assemblies (for each different type of storage device carrier) or rely on a service person or a customer to disassemble the storage device from its storage device carrier to insert a new storage device before it can be reinstalled in the chassis.

As will be described in further detail herein, the inventors of the present disclosure have discovered systems and methods for carrier-less storage device extraction utilizing a carrier-less storage shuttle in an information handling system. A carrier-less storage shuttle provides a method for insertion and removal of a storage device without other mechanical means such as a storage device carrier. The carrier-less storage shuttle includes a latch assembly that enables servicing of a storage device. The latch assembly is attached to a strap which smoothly unseats the storage device from its electrical connector when the latch assembly is unlatched and pulled in an outward direction from an enclosure of the rack-mountable computing device 210. Thus, exposing the end of the storage device to allow a service-person to remove it. Upon reinsertion of the storage device in the enclosure, the strap is pushed back into its engaged position and the latch assembly locks the storage device in place.

Figure 3:
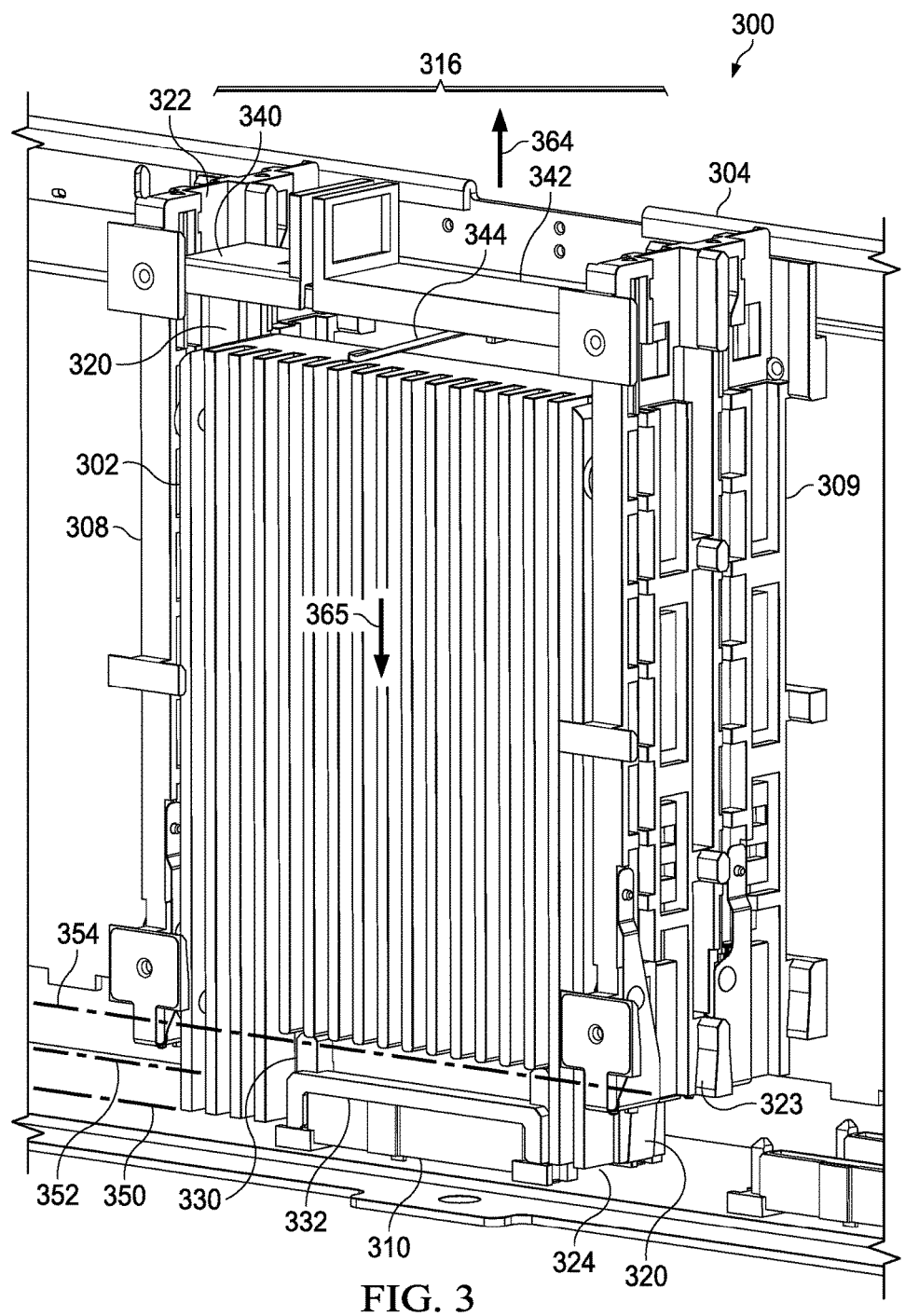
FIG. 3 is a perspective view of selected elements of an embodiment of a carrier-less storage shuttle.
Figure 4A:
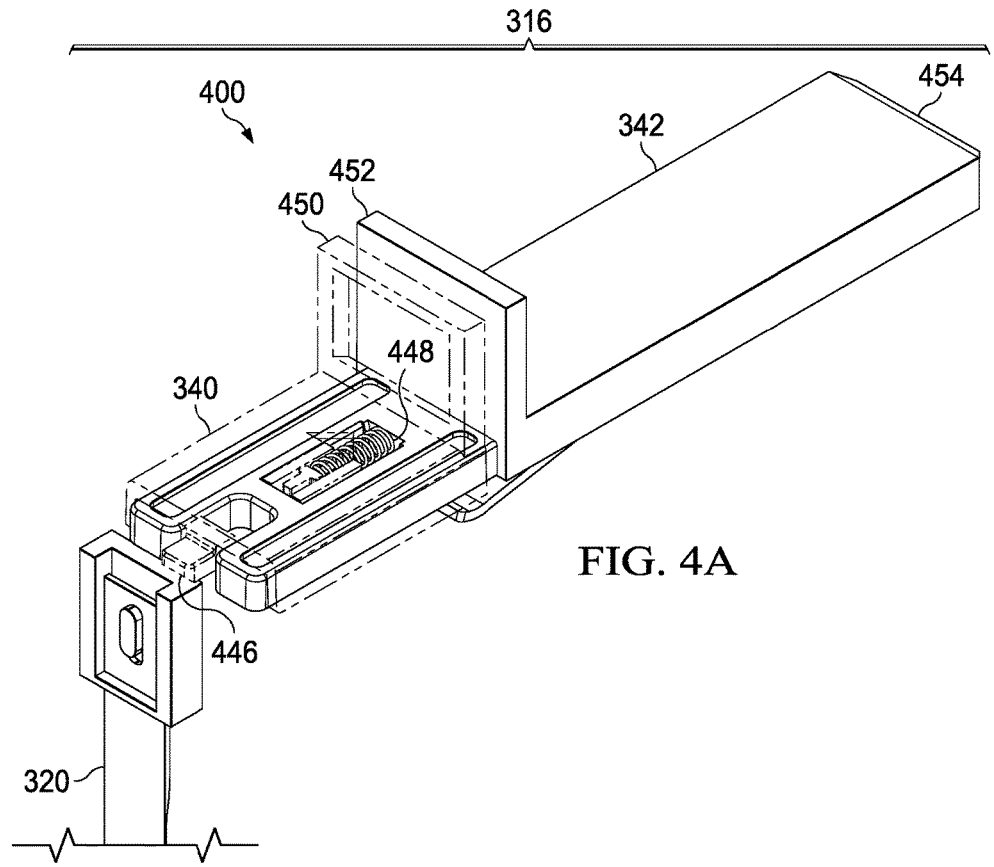
FIGS. 4A and 4B are various views of selected elements of an embodiment of a latch assembly for use with the carrier-less storage shuttle of FIG. 3.
Figure 4B:
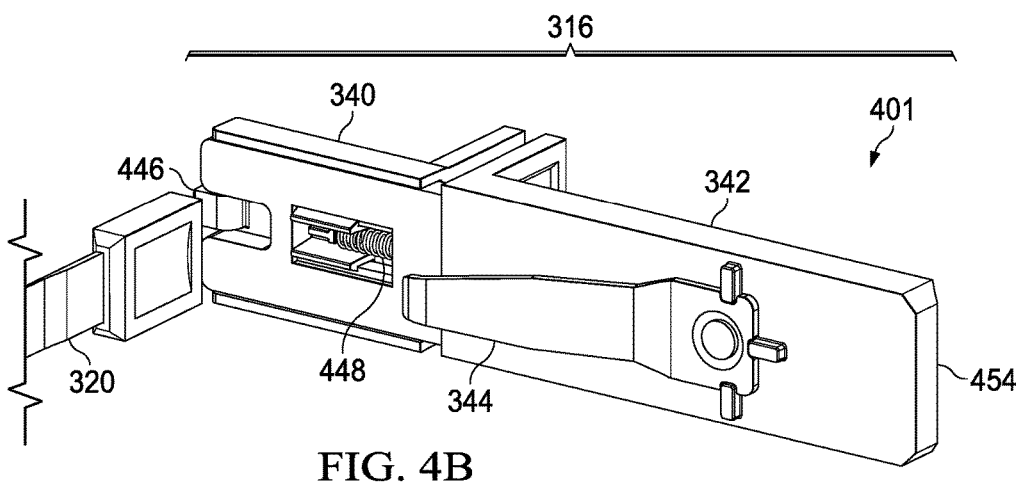
Figure 5:
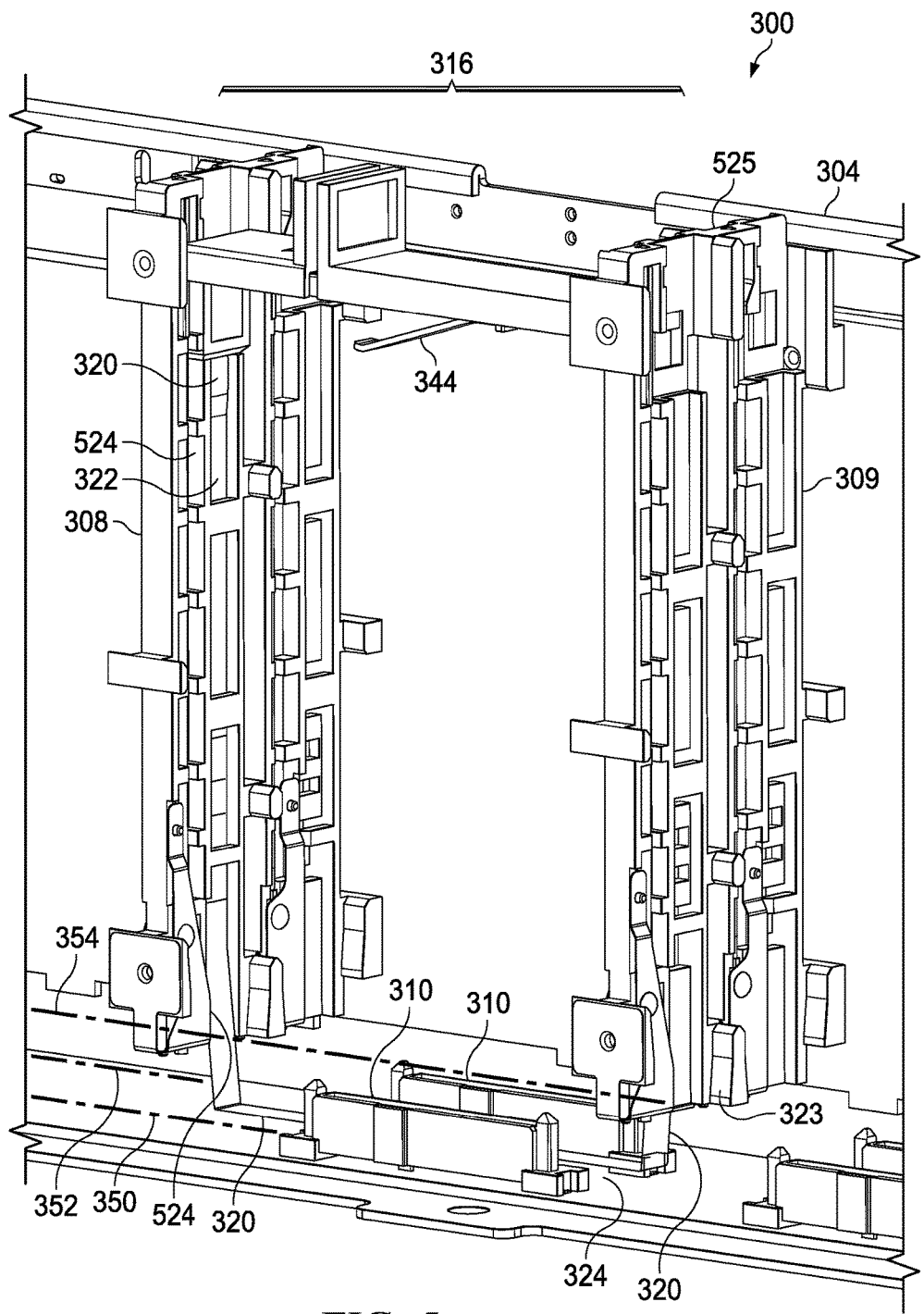
FIG. 5 is a perspective view of selected elements of an embodiment of the carrier-less storage shuttle of FIG. 3.
Figure 6:
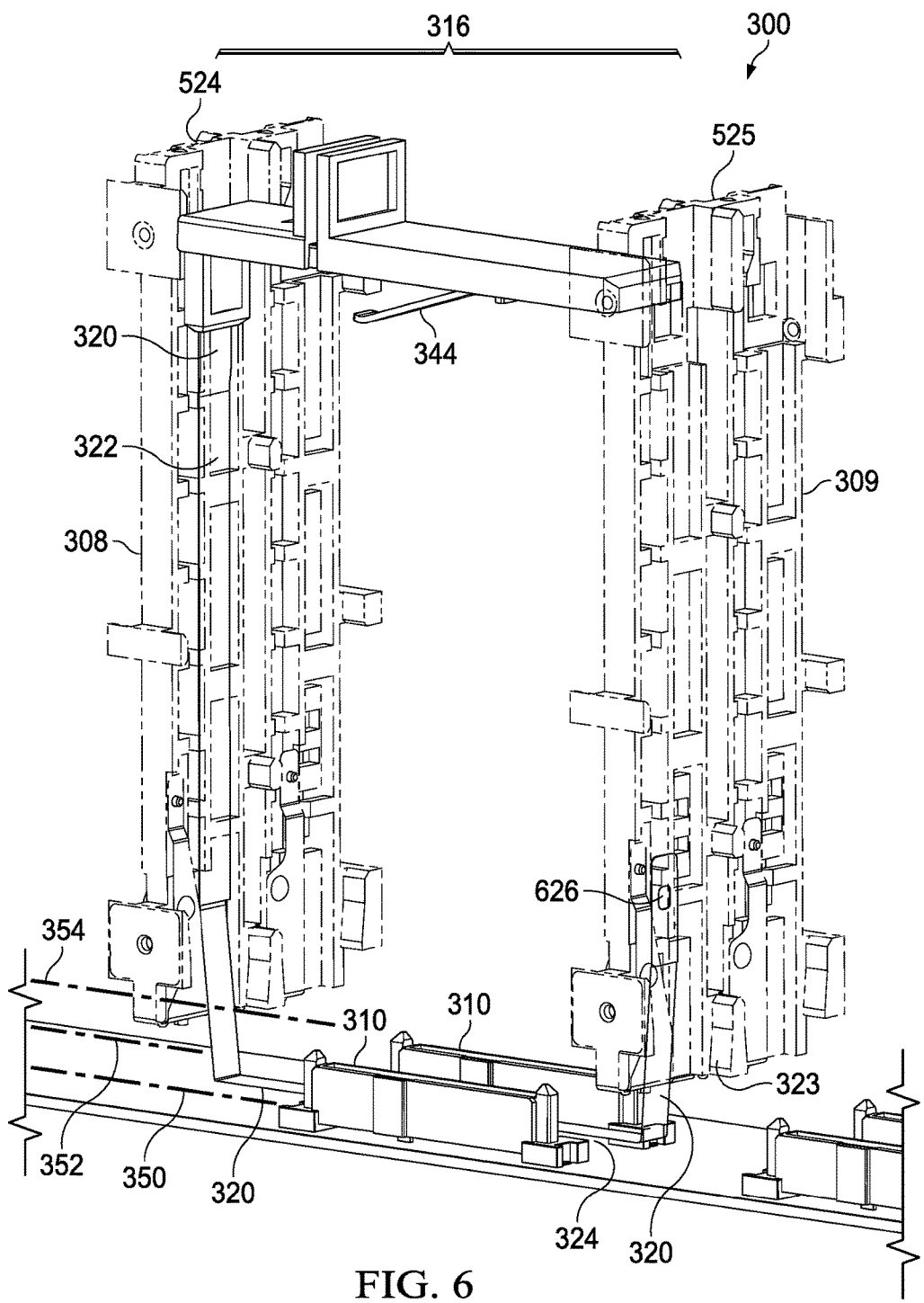
FIG. 6 is a perspective view of selected elements of an embodiment of the carrier-less storage shuttle of FIG. 3.

Referring to FIGS. 3, and 5-9, perspective views of selected elements of an embodiment of a carrier-less storage shuttle 300 are shown. Carrier-less storage shuttle 300 may be configured to allow for the easy installation and removal of storage devices from (in this example) rack-mountable computing device 210. In FIGS. 3, 5, and 6, carrier-less storage shuttle 300 is depicted in a latched position. While the following discussion concerns carrier-less storage shuttle 300 being utilized within rack-mountable computing device 210, this is for illustrative purposes only and is not intended to be a limitation of this disclosure, as other configurations are possible and are considered to be within the scope of this disclosure. For example, carrier-less storage shuttle 300 may be utilized within commercial-grade, non-rack-mountable computing devices or consumer-grade computing devices.

Carrier-less storage shuttle 300 may be configured to releasably secure a storage device 302 within an enclosure assembly 304. An example of enclosure assembly 304 may include but is not limited to a chassis, sub-chassis, enclosure, or sub-enclosure (or portion thereof) of rack-mountable computing device 210. Examples of storage device 302 may include one or more of storage devices 232, 234, 236, 238, 240, 242, 244, 246, 248, 250, 252, 254.

Carrier-less storage shuttle 300 may be rigidly affixed to enclosure assembly 304 and may be configured to releasably engage storage device 302. An example of carrier-less storage shuttle 300 that is rigidly affixed to enclosure assembly 304 may include a frame that is sized to receive storage device 302. Specifically, carrier-less storage shuttle 300 may allow for storage device 302 to fit snuggly within (and slide snuggly into) carrier-less storage shuttle 300, thus allowing for the insertion and removal of storage device 302 into carrier-less storage shuttle 300 (and, therefore, enclosure assembly 304).

Carrier-less storage shuttle 300 may include side portions 308 and 309, a bottom portion 310, a latch assembly 316, and a strap 320. Side portions 308 and 309 may include guide channels 322 and 323 respectively, and bottom portion 310 may include guide channel 324. Strap 320 may include a first end and a second end. The first end of strap 320 may be coupled to latch assembly 316 and the second end of strap 320 may be coupled to side portion 309 in a fixed position. Strap 320 may also be movably coupled within guide channel 322 of side portion 308, movable into and out of guide channel 323 of side portion 309, and movable into and out of guide channel 324 of bottom portion 310. Side portions 308 and 309, bottom portion 310, latch assembly 316, strap 320, and guide channels 322, 323, and 324 may be configured to releasably engage storage device 302.

Carrier-less storage shuttle 300 may be configured to electrically couple storage device 302 to an electrical connector (e.g., electrical connector 332) within enclosure assembly 304 when storage device 302 is moved into engaged position 350. Storage device 302 may include electrical connector 330 for electrically coupling storage device 302 to electrical connector 332 within enclosure assembly 304.

Carrier-less storage shuttle 300 may also be configured to electrically uncouple storage device 302 from electrical connector 332 within enclosure assembly 304 when storage device 302 is moved into a disengaged position (e.g., disengaged position 352).

Latch assembly 316 may be configured to releasably affix storage device 302 within enclosure assembly 304 at an engaged position (e.g., engaged position 350). As shown in FIG. 3, Latch assembly 316 may include lock portions 340 and 342 and one or more biasing devices (e.g., biasing device 344). Lock portions 340 and 342 may be configured to releasably lock latch assembly in a latched position and, therefore, releasably lock storage device 302 in engaged position 350. Specifically, lock portions 340 and 342 may be configured to releasably engage a mating slot of side portion 308 and a mating slot of side portion 309 (not shown) to releasably hold latch assembly 316 proximate a top surface of storage device 302. Biasing device 344 may be configured to bias storage device 302 toward electrical connector 332 within enclosure assembly 304 when storage device 302 is moved into engaged position 350. As shown in the various views of FIGS. 4A and 4B, latch assembly 316 may also include a spring 448 disposed in lock portion 340. Lock portion 340 may include a tab 446 proximate a first end of lock portion 340 that extends beyond the first end and a handle portion 450 proximate a second end of lock portion 340 opposite the first end. Lock portion 342 may include a chamfered end 454 and a handle portion 452 proximate a second end of lock portion 342 opposite chamfered end 454. Strap 320 is coupled to latch assembly 316 proximate the first end of lock portion 340. When latch assembly 316 is in the latched position, tab 446 is extended in and engaged with the mating slot of side portion 308, chamfered end 454 of lock portion 342 is extended in and engaged with the mating slot of side portion 309, handle portions 450 and 452 are separated from each other by a gap, and a first force on both lock portion 340 and 342 is exerted by spring 448 to lock latch assembly 316 in place. When handle portions 450 and 452 are squeezed together with a second force opposite to and greater than the first force of spring 448, tab 446 disengages from the mating slot of side portion 308, chamfered end 454 disengages from the mating slot of side portion 309, latch assembly 316 unlocks and moves to an unlatched position. When handle portions 450 and 452 are squeezed together and latch assembly 316 is in the unlatched position, latch assembly 316 may be pulled in an outward direction 364 away from carrier-less storage shuttle 300. When latch assembly 316 is pulled in outward direction 364, strap 320 is moved from engaged position 350 to a strap stop position 354 and storage device 302 is moved from engaged position 350 to disengaged position 352. In some embodiments, strap stop position 354 may be the same position as disengaged position 352.

Strap 320 may be configured to move from strap stop position 354 to engaged position 350 by moving within guide channel 322 of side portion 208 and moving into guide channels 323 and 324 of side portion 209 and bottom portion 310 respectively when storage device 302 is inserted into carrier-less storage shuttle 300 and pushed in an inward direction 365, strap 320 is contacted by a bottom surface of storage device 302, and storage device 302 is moved from disengaged position 352 to engaged position 350.

Strap 320 may also be configured to move from engaged position 350 to strap stop position 354 by moving within guide channel 322 of side portion 208 and feeding toward side portion 208 and outward in outward direction 364 out of guide channels 323 and 324 of side portion 209 and bottom portion 310 respectively when the first end of strap 320 is pulled in outward direction 364 away from carrier-less storage shuttle 300. When strap 320 is pulled in outward direction 364 and the bottom surface of storage device 302 is contacted by strap 320, electrical connector 330 of storage device 302 is decoupled from electrical connector 332 of enclosure assembly 304, and storage device 302 is moved from engaged position 350 to disengaged position 352.

Strap 320 may be in engaged position 350 when storage device 302 is in carrier-less storage shuttle 300 and is in engaged position 350. When strap 320 is in engaged position 350, latch assembly 316 is latched and locked, strap 320 is entirely within carrier-less storage shuttle 300, a first portion of strap 320 is within guide channel 323 extending from proximate the top end of side portion 308 to a bottom end of side portion 308 proximate engaged position 350, a second portion of strap 320 is within guide channel 324 of bottom portion 310 proximate engaged position 350 and extends from the bottom end of side portion 308 to a bottom end of side portion 309 proximate engaged position 350, and a third portion of strap 320 is within guide channel 323 of side portion 309 and extends from the bottom end of side portion 309 to at least disengaged position 352 of side portion 309.

Strap 320 may be in strap stop position 354 when storage device 302 is either not in carrier-less storage shuttle 300 or storage device is at or above disengaged position 352. When strap 320 is in disengaged position 352, latch assembly 316 is unlocked and unlatched, a first portion of strap 320 proximate the first end of strap 320 extends beyond a top end of side portion 308, a second portion of strap 320 is within guide channel 323 extending from proximate the top end of side portion 308 to a lower end of side portion 308 proximate disengaged position 352, a third portion of strap 320 is generally parallel and above bottom portion 310 proximate disengaged position 352 and extends from the lower end of side portion 308 to a lower end of side portion 309.

In FIG. 5, carrier-less storage shuttle 300 is shown in latched position without storage device 302 to further depict the position and placement of the components of carrier-less storage shuttle 300. Side portions 308 and 309 of carrier-less storage shuttle 300 may also include alignment channels 524 and 525 respectively for aligning storage device 302 within carrier-less storage shuttle 300 and enclosure assembly 304. Specifically, alignment channels 524 and 525 may be configured to allow storage device 302 to slide within alignment channels 524 and 525, thus ensuring proper alignment of electrical connectors 332, 330.

In FIG. 6, carrier-less storage shuttle 300 is shown in latched position without storage device 302 to further depict the position and placement of the components of carrier-less storage shuttle 300. Side portion 309 of carrier-less storage shuttle 300 may also include a stop assembly 626 for preventing strap 320 from moving beyond strap stop position 354 when strap 320 is moved from engaged position 350 to strap stop position 354 so that storage device 302 is held at strap stop position 354 until fully removed from carrier-less storage shuttle 300 and enclosure assembly 304. Holding storage device 302 at strap stop position 354 allows storage device 302 to remain within carrier-less storage shuttle 300 until a service person securely holds storage device 302 and fully removes it from enclosure assembly 304, which may prevent storage device 302 from falling out of enclosure assembly and possibly damaging the device.

Figure 7:
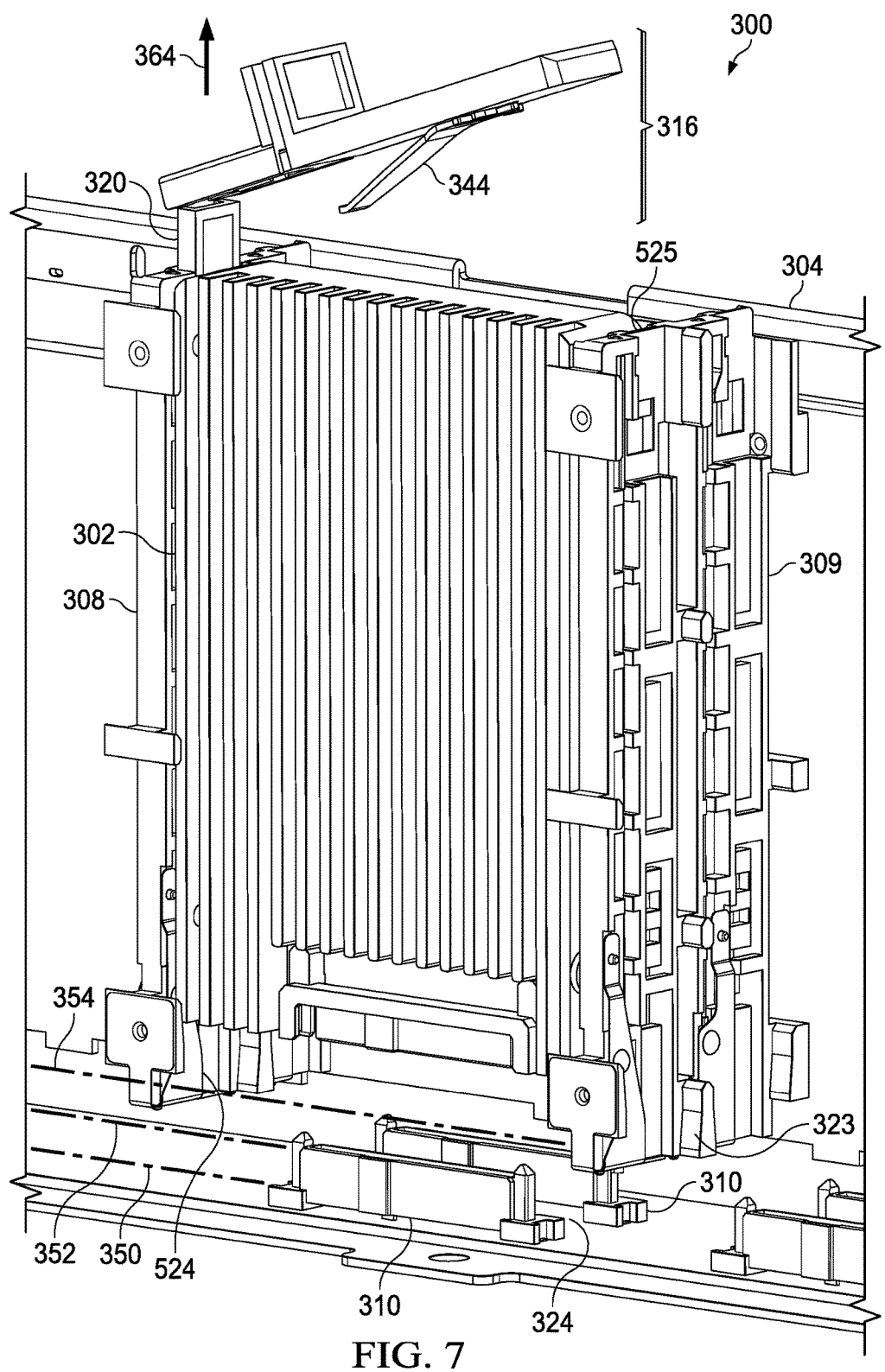
FIG. 7 is a perspective view of selected elements of an embodiment of the carrier-less storage shuttle of FIG. 3.
Figure 8:
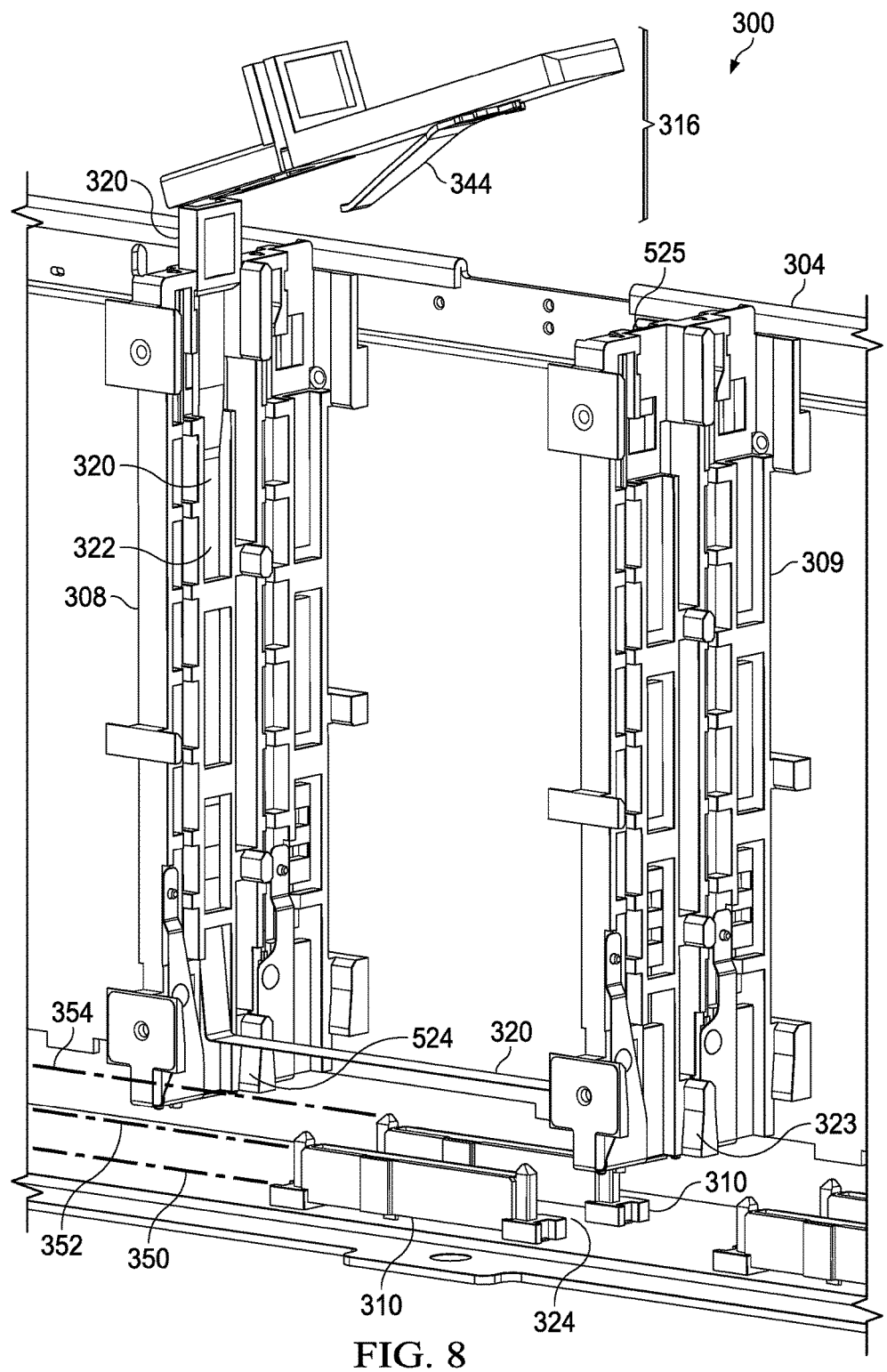
FIG. 8 is a perspective view of selected elements of an embodiment of the carrier-less storage shuttle of FIG. 3.
Figure 9:
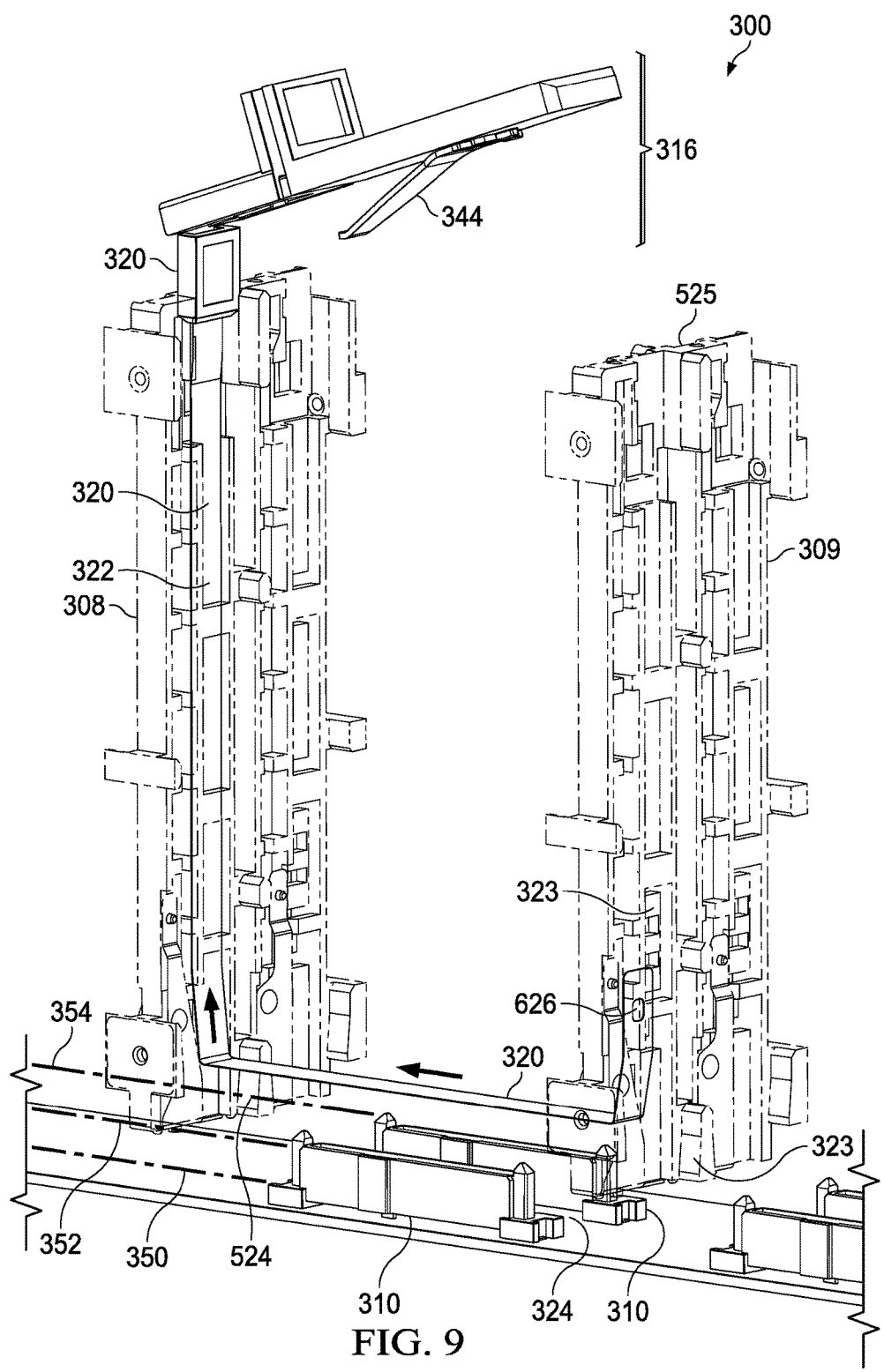
FIG. 9 is a perspective view of selected elements of an embodiment of the carrier-less storage shuttle of FIG. 3.

In FIGS. 7, 8, and 9, carrier-less storage shuttle 300 is shown in an unlatched position after latch assembly 316 has been pulled in outward direction 364, strap 320 has been moved from engaged position 350 to strap stop position 354, electrical connector 330 of storage device 302 has been decoupled from electrical connector 332 of enclosure assembly 304, and storage device 302 has been moved from engaged position 350 to strap stop position 354.

Additionally, carrier-less storage shuttle 300 may include one or more grounding assemblies for electrically coupling carrier-less storage shuttle 300 with enclosure assembly 304 and carrier-less storage shuttle 300 may be electrically conductive. Accordingly, carrier-less storage shuttle 300 may be constructed of an electrically conductive material (e.g., steel or aluminum) or may be coated in an electrically conductive material (e.g., through vacuum metallization), wherein enclosure assembly 304 and carrier-less storage shuttle 300 may be electrically coupled.

An electrostatic discharge path may be formed via the combination of carrier-less storage shuttle 300 and the one or more grounding assemblies, thus allowing for the grounding of any electrostatic energy through this discharge path and not through storage device 302. Further, as latch assembly 316 needs to be unlatched prior to the servicing of e.g., storage device 302, the servicer of the system would discharge any electrostatic charge prior to being able to touch storage device 302 and will only be able to touch storage device 12 after it had been uncoupled from electrical connector 332.

Figure 10:
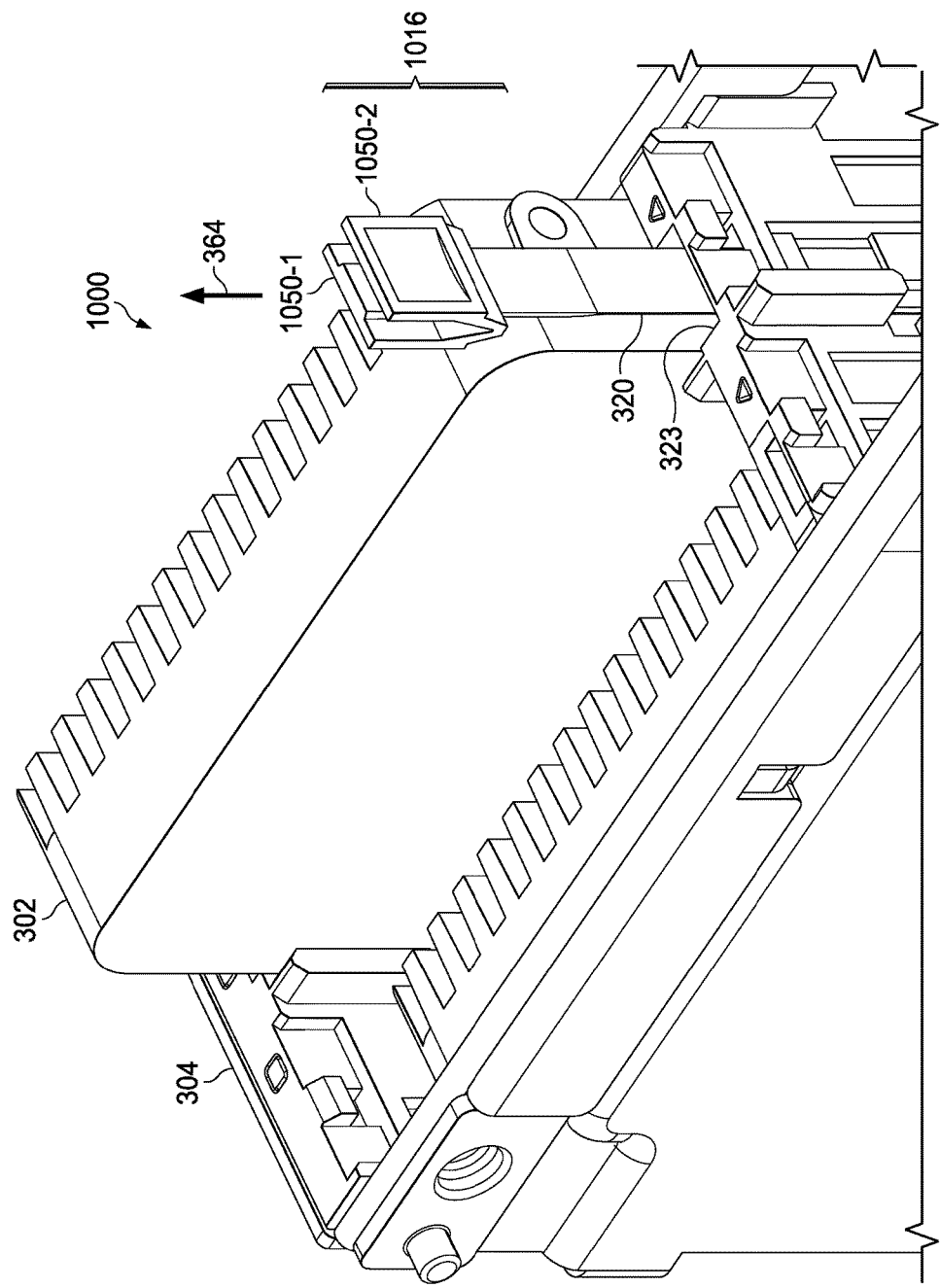
FIG. 10 is a perspective view of selected elements of an embodiment of another carrier-less storage shuttle.

Turning now to FIG. 10, a perspective view of selected elements of an embodiment of another carrier-less storage shuttle 1000 is depicted. Carrier-less storage shuttle 1000 includes a handle assembly 1016, strap 320, and guide channel 324, and most of the other components of carrier-less storage shuttle 300 not shown in FIG. 10. Carrier-less storage shuttle 1000 is structurally and operationally similar to carrier-less storage shuttle 300 previously describe with reference to FIGS. 3 and 5-9, except that carrier-less storage shuttle 1000 includes handle assembly 1016 instead of latch assembly 316 of carrier-less storage shuttle 300. Handle assembly 1016 operates differently from latch assembly 316.

Handle assembly 1016 includes handle portions 1050-1 and 1050-2, which may form a V shape. Handle assembly 1016 may be configured to engage with side portion 308 of carrier-less storage shuttle 1000 when storage device 302 is inserted into carrier-less storage shuttle 1000, moved to engaged position 350, and electrical connector 330 of storage device 302 has been coupled to electrical connector 332 of enclosure assembly 304. Handle assembly 1016 may also be configured to decouple electrical connector 330 of storage device 302 from electrical connector 332 of enclosure assembly 304 and storage device 302 to be moved from engaged position 350 to stop position 354, when handle assembly 1016 is disengaged with side portion 308 and is pulled in outward direction 364. Strap 320 is coupled to handle assembly 1016 proximate the first end of strap 320.

When handle portions 1050-1 and 1050-2 are squeezed together, handle assembly 1016 may disengage from side portion 308 and handle assembly 1016 may be pulled in outward direction 364 away from carrier-less storage shuttle 1000, which causes strap 320 to be pulled from engaged position 350 to stop position 340, electrical connector 330 of storage device 302 to be decoupled from electrical connector 332 of enclosure assembly 304, and storage device 302 to be moved from engaged position 350 to stop position 354. When storage device 302 is inserted into carrier-less storage shuttle 1000, moved into contact with strap 320, and moved into engaged position 350, strap 320 may be moved from stop position 354 to engaged position 350, and handle assembly 1016 may reengaged with side portion 308 of carrier-less storage shuttle 1000.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A carrier-less storage shuttle, comprising:
   a first side having a first guide channel and a second side, the first side and the second side rigidly affixed to an enclosure assembly;
   a latch assembly configured to releasably affix a storage device at an engaged position within the enclosure assembly; and
   a strap including a first end coupled to the latch assembly, a second end coupled to the second side, and the strap movably coupled within the first guide channel, the strap configured to:
      when the storage device is in the engaged position, a bottom surface of the storage device is in contact with the strap, and the latch assembly is unlatched and moved in a generally outward direction from the enclosure assembly, move in the generally outward direction within the first guide channel such that the storage device moves from the engaged position to a disengaged position.

2. The carrier-less storage shuttle of claim 1, wherein the strap further configured to:
   when the strap is contacted by the bottom surface of the storage device and the storage device is moved into the engaged position, the strap is moved within the first guide channel from an extracted position to a ready to extract position.

3. The carrier-less storage shuttle of claim 1, wherein the carrier-less storage shuttle further comprises:
   a stop assembly coupled to the second side in a fixed position and configured to limit an amount of travel of the strap when the storage device is moved by the strap from the engaged position to the disengaged position such that the storage device remains in the carrier-less storage shuttle.

4. The carrier-less storage shuttle of claim 1, wherein the second side further comprises:
   a second guide channel, and wherein the strap is further movably coupled within the second guide channel.

5. The carrier-less storage shuttle of claim 1, wherein the carrier-less storage device further comprises:
   a bottom side having a third guide channel rigidly affixed to the enclosure assembly, and wherein the strap is further movably coupled within the third guide channel.

6. The carrier-less storage shuttle of claim 1, wherein the carrier-less storage device further configured to:
   electrically couple the storage device to an enclosure electrical connector within the enclosure assembly when the storage device is moved into the engaged position.

7. The carrier-less storage shuttle of claim 1, wherein the carrier-less storage device further configured to:
   electrically uncouple the storage device from an enclosure electrical connector within the enclosure assembly when the storage device is moved into the disengaged position.

8. The carrier-less storage shuttle of claim 1, wherein the latch assembly further comprises:

a bias device configured to bias the storage device toward an enclosure electrical connector within the enclosure assembly when the storage device is moved into the engaged position.

9. The carrier-less storage shuttle of claim 1, wherein the latch assembly further comprises:
a first lock portion comprising:
a tab coupled to a first end of the first lock portion; and
a first handle portion coupled to a second end of the first lock portion; and
a second lock portion comprising:
a first handle portion coupled to a first end of the first lock portion;
a spring disposed within the first lock portion between the first end and the second end and configured to exert a first force on the tab in a direction towards the first end of the first lock portion, and wherein
the latch assembly configured to:
when the first handle portion and the second handle portion are squeezed together, the tab disengages from a first mating slot of the first side and the second end of the second lock portion disengages from a second mating slot of the second side to allow the latch assembly to be moved in the outward direction away from the carrier-less storage shuttle; and
when the latch assembly is moved to a latched position, the tab engages with the first mating slot and the second end of the second lock portion engages with the second mating slot to cause the latch assembly to lock.

10. The carrier-less storage shuttle of claim 1, wherein each of the first side and the second side further comprises a respective alignment channel for aligning the storage device within the carrier-less storage shuttle.

11. The carrier-less storage shuttle of claim 1, wherein, when the storage device is in the engaged position, a first portion of the strap is within the first guide channel, a second portion of the strap is within the second guide channel, and a third portion of the strap between the first side and the second side is within a third guide channel of a bottom side of the carrier-less storage shuttle and generally parallel to the bottom surface of the storage device.

12. The carrier-less storage shuttle of claim 1, wherein, when the storage device is in the disengaged position, a first portion of the strap is within the first guide channel, a second portion of the strap is within the second guide channel, a third portion of the strap between the first side and the second side is above a third guide channel of a bottom side of the carrier-less storage shuttle and generally parallel to the bottom surface of the storage device, and a fourth portion of the strap proximate the latch assembly is outside a top portion of the first side.

13. A carrier-less storage shuttle, comprising:
a first side having a first guide channel and a second side having a second guide channel, the first side and the second side rigidly affixed to an enclosure assembly;
a latch assembly configured to releasably affix a storage device at an engaged position within the enclosure assembly; and
a strap including a first end coupled to the latch assembly, a second end coupled to the second side, and the strap movably coupled within the first guide channel and the second guide channel, the strap configured to:
when the storage device is in the engaged position, a bottom surface of the storage device is in contact with the strap, and the latch assembly is unlocked and moved in a generally outward direction from the enclosure assembly, move in the generally outward direction within the first guide channel and the second guide channel such that the storage device is electrically uncoupled from an enclosure electrical connector within the enclosure assembly and moves from the engaged position to a disengaged position.

14. The carrier-less storage shuttle of claim 13, wherein the strap further configured to:
when the strap is contacted by the bottom surface of the storage device and the storage device is moved into the engaged position, the strap is moved within the first guide channel and the second guide channel from an extracted position to a ready to extract position.

15. The carrier-less storage shuttle of claim 13, wherein the carrier-less storage shuttle further comprises:
a stop assembly coupled to the second side in a fixed position and configured to limit an amount of travel of the strap when the storage device is moved by the strap from the engaged position to the disengaged position such that the storage device remains in the carrier-less storage shuttle.

16. The carrier-less storage shuttle of claim 13, wherein, when the storage device is in the disengaged position, a first portion of the strap is within the first guide channel, a second portion of the strap is within the second guide channel, a third portion of the strap between the first side and the second side is above a third guide channel of a bottom side of the carrier-less storage shuttle and generally parallel to the bottom surface of the storage device, and a fourth portion of the strap proximate the latch assembly is outside a top portion of the first side.

17. A carrier-less storage shuttle, comprising:
a first side having a first guide channel and a second side having a second guide channel, the first side and the second side rigidly affixed to an enclosure assembly;
a handle assembly; and
a strap including a first end coupled to the handle assembly, a second end coupled to the second side, and the strap movably coupled within the first guide channel and the second guide channel, the strap configured to:
when the storage device is in an engaged position within the enclosure assembly, a bottom surface of the storage device is in contact with the strap, and the handle assembly is moved in a generally outward direction from the enclosure assembly, move in the generally outward direction within the first guide channel and the second guide channel such that the storage device moves from the engaged position to a disengaged position.

18. The carrier-less storage shuttle of claim 13, wherein the strap further configured to:
when the strap is contacted by the bottom surface of the storage device and the storage device is moved into the engaged position, the strap is moved within the first guide channel and the second guide channel from an extracted position to a ready to extract position.

19. The carrier-less storage shuttle of claim 1, wherein the carrier-less storage shuttle further comprises:
a stop assembly coupled to the second side in a fixed position and configured to limit an amount of travel of the strap when the storage device is moved by the strap from the engaged position to the disengaged position such that the storage device remains in the carrier-less storage shuttle.

20. The carrier-less storage shuttle of claim 1, wherein, when the storage device is in the disengaged position, a first portion of the strap is within the first guide channel, a second portion of the strap is within the second guide channel, a third portion of the strap between the first side and the second side is above a third guide channel of a bottom side of the carrier-less storage shuttle and generally parallel to the bottom surface of the storage device, and a fourth portion of the strap proximate the handle assembly is outside a top portion of the first side.

* * * * *